(12) United States Patent
Liang et al.

(10) Patent No.: US 8,131,234 B2
(45) Date of Patent: Mar. 6, 2012

(54) TRANSMITTER UTILIZING A DUTY CYCLE ENVELOPE REDUCTION AND RESTORATION MODULATOR

(75) Inventors: Paul Cheng-Po Liang, Santa Clara, CA (US); Koji Takinami, Saratoga, CA (US); Toru Matsuura, Osaka (JP)

(73) Assignee: Panasonic Corporation, Osaka (JP)

( * ) Notice: Subject to any disclaimer, the term of this patent is extended or adjusted under 35 U.S.C. 154(b) by 462 days.

(21) Appl. No.: 12/508,464

(22) Filed: Jul. 23, 2009

(65) Prior Publication Data

US 2011/0018640 A1    Jan. 27, 2011

(51) Int. Cl.
*H01Q 11/12* (2006.01)
*H04B 1/04* (2006.01)

(52) U.S. Cl. ............... 455/127.1; 455/127.5; 455/127.4; 455/102

(58) Field of Classification Search .... 455/127.1–127.5, 455/574, 102; 375/295, 353
See application file for complete search history.

(56) References Cited

U.S. PATENT DOCUMENTS

| | | | |
|---|---|---|---|
| 6,326,851 B1 | 12/2001 | Staszewski et al. | |
| 6,404,823 B1 * | 6/2002 | Grange et al. | 375/297 |
| 6,529,716 B1 * | 3/2003 | Eidson et al. | 455/115.1 |
| 6,734,724 B1 | 5/2004 | Schell et al. | |
| 7,209,065 B2 | 4/2007 | Wood | |
| 7,664,202 B2 * | 2/2010 | Hara et al. | 375/297 |
| 7,944,994 B2 * | 5/2011 | Matsuura et al. | 375/302 |
| 2004/0071225 A1 * | 4/2004 | Suzuki et al. | 375/297 |
| 2004/0185803 A1 * | 9/2004 | Tanabe et al. | 455/108 |
| 2004/0263245 A1 * | 12/2004 | Winter et al. | 330/10 |
| 2004/0266366 A1 * | 12/2004 | Robinson et al. | 455/91 |
| 2005/0163253 A1 | 7/2005 | Matsuura et al. | |
| 2009/0004981 A1 * | 1/2009 | Eliezer et al. | 455/127.1 |
| 2009/0176464 A1 | 7/2009 | Liang et al. | |
| 2010/0015932 A1 * | 1/2010 | Liang et al. | 455/102 |
| 2010/0056068 A1 * | 3/2010 | Takinami et al. | 455/73 |

OTHER PUBLICATIONS

Stauth, Jason et al.; A 2.4 GHz, 20dBm Class-D PA with Single-Bit Digital Polar Modulation in 90nm CMOS; IEEE 2008 Custom Integrated Circuits Conference (CICC); pp. 737-740.
Larson, Lawrence et al.; Digital Control of RF Power Amplifiers for Next-Generation Wireless Communications; Proceedings of ESSDERC, Frenoble, France, 2005; pp. 39-44.

* cited by examiner

*Primary Examiner* — Duc M Nguyen

(57) ABSTRACT

A broad power band transmitter utilizing a duty cycle modulator achieves 80dB of power range for 3G signals. The present invention greatly improves the efficiency of transmitters used in mobile phones, for example, by using the duty cycle modulator during medium and low power levels of the transmitting power amplifier. The power amplifier operates in three different modes based upon the amplifier power level selected. The power amplifier operates in an EER mode during high power levels, in a DCM ERR mode during medium power levels, and in a DCM mode during low power levels.

24 Claims, 20 Drawing Sheets

TRANSMITTER UTILIZING A DUTY CYCLE ENVELOPE REDUCTION AND RESTORATION MODULATOR

BACKGROUND OF THE INVENTION

1. Field of the Invention

The present invention relates to communication transmitters and more specifically to power amplifiers in communication transmitters.

2. Description of Related Art

Transmitters used in mobile phones vary their output power when transmitting signals. Although improvements have been made to the efficiency of such transmitters at high power ranges, improvements in efficiency when operating at medium and low power ranges have largely been ignored. While efficiency improvements at high power ranges result in energy savings, such energy savings tend to be minimal due to the relatively shorter periods of time that mobile phones operate at a high power output. FIG. 1 represents a graph of probability of use of mobile phones, against output power level, in both suburban and urban areas. Mobile phones spend much more time at medium power ranges and low power ranges than at high power ranges.

There is an unresolved need for an apparatus and method to improve mobile phone efficiency when operating at medium power ranges and low power ranges.

SUMMARY OF THE INVENTION

The present invention provides a much more efficient transmitter for mobile phones, by operating the power amplifiers in different modes, depending on the selected power output of the power amplifier. The transmitter changes the operating characteristics of the power amplifier to provide for the greatest amount of efficiency across the entire power band. At high power ranges, the power amplifier is operated in an Envelope Elimination and Restoration ("EER") mode in the compressed region. In this mode, all the amplitude modulation is provided to the amplifier at the supply port, with the radio frequency ("RF") input modulator turned off. At medium power ranges, the power amplifier is in a Duty Cycle Modulation Envelope Reduction and Restoration ("DCM ERR") mode, in the compressed region. In this mode both the supply port and RF input port provide parts of the amplitude modulation required to get full dynamic range. At low power ranges, the power amplifier is operated in a Duty Cycle Modulation ("DCM") mode, with the supply modulation turned off. Duty cycle modulation used at medium and low power ranges provides a considerable improvement in operating efficiency. The high, medium, and low power ranges are determined on the basis of the specification for Adjacent Channel Leakage Ratio ("ACLR"), like for example, ACLR 5, ACLR 10, and receive band noise at a 45 MHz offset.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Figure 1:
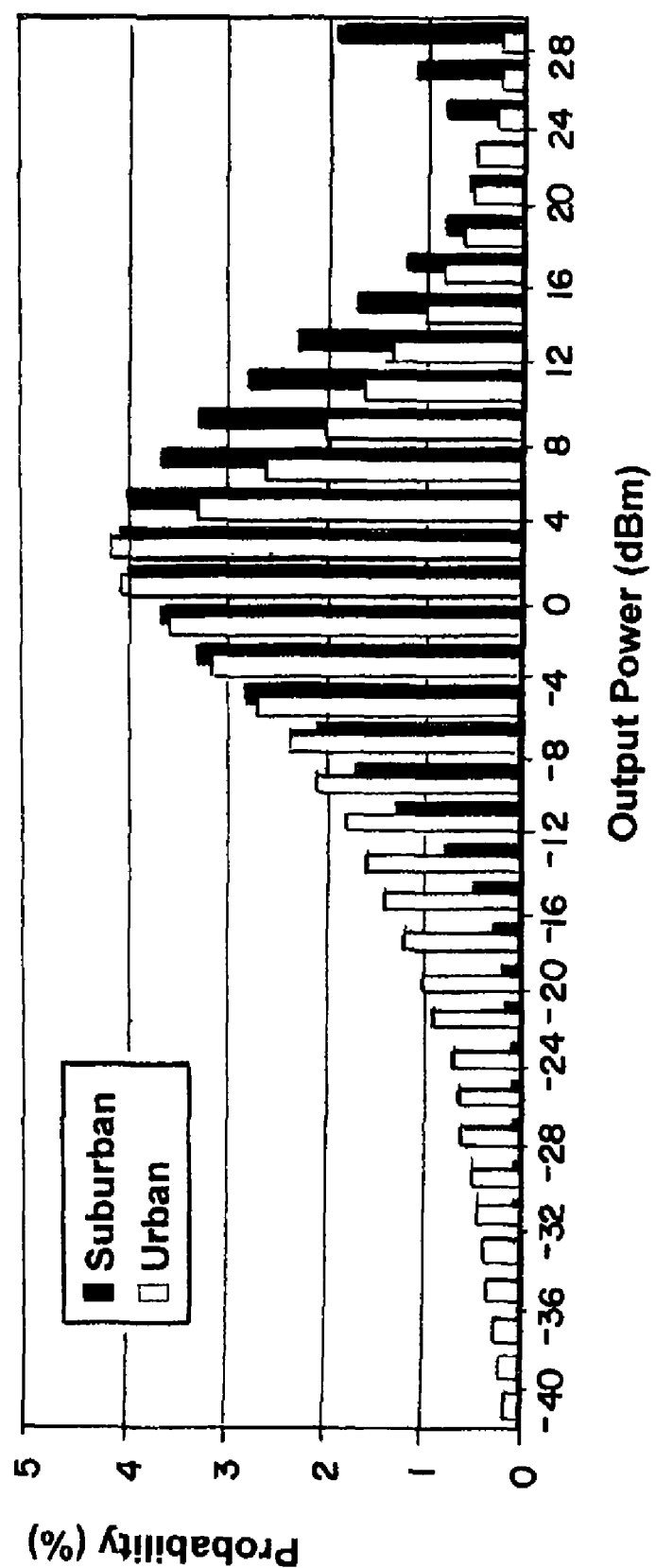
FIG. 1 is a graph illustrating probability density for power consumption of mobile phones in urban and suburban environments.
Figure 2:
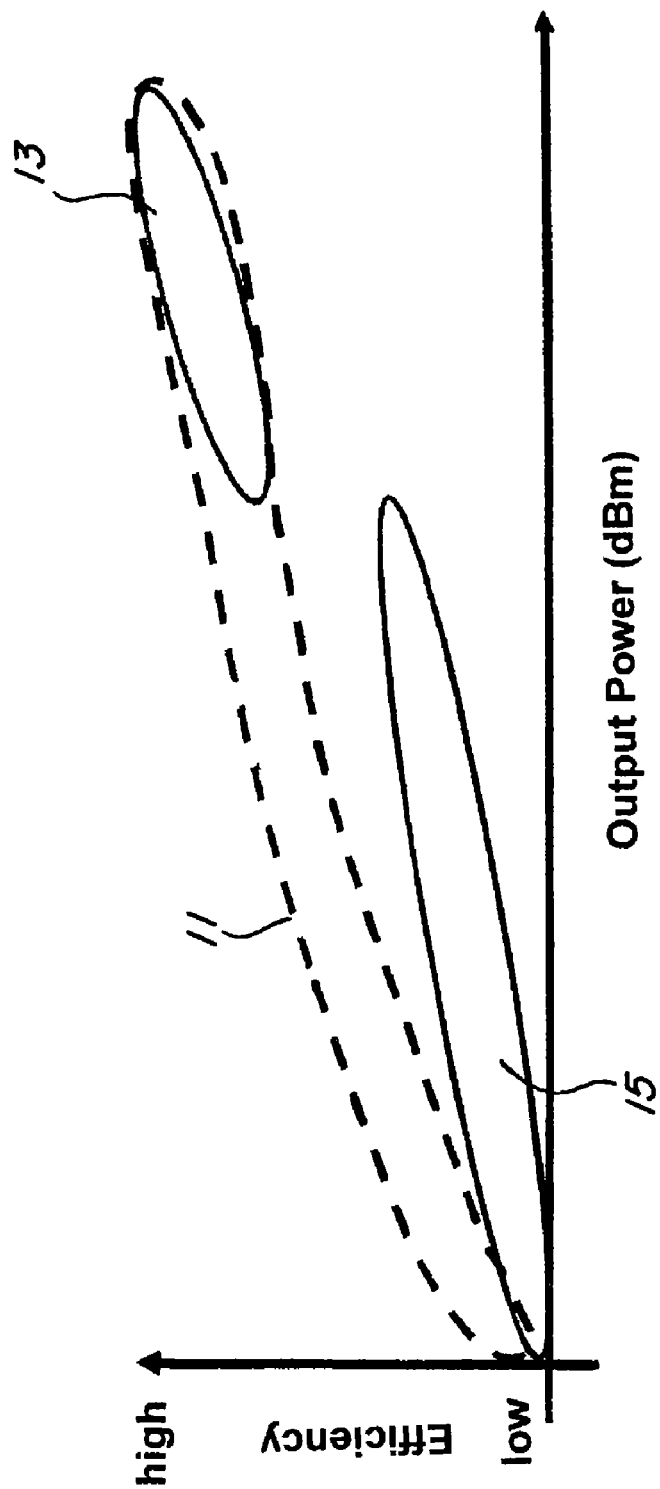
FIG. 2 is graph illustrating power efficiency of mobile phones across the used power band using a Duty Cycle Modulation Envelope Reduction and Restoration ("DCM ERR") mode and Envelope Elimination and Restoration ("EER") mode.

Referring to FIG. 2, a power amplifier operating in envelope elimination and restoration ("EER") mode, also known as polar modulation, is efficient at high power ranges, depicted by region 13. However, EER modulation sacrifices efficiency at low and medium power ranges, depicted by region 15.

In contrast, a power amplifier according to the present invention, utilizes a combination of EER modulation and Duty Cycle Modulation Envelope Reduction and Restoration ("DCM ERR") modulation, as depicted by region 11. The power amplifier operates at the high efficiency of the EER mode at high power ranges, and a much higher efficiency than the EER mode, at low and medium power ranges.

Figure 3:
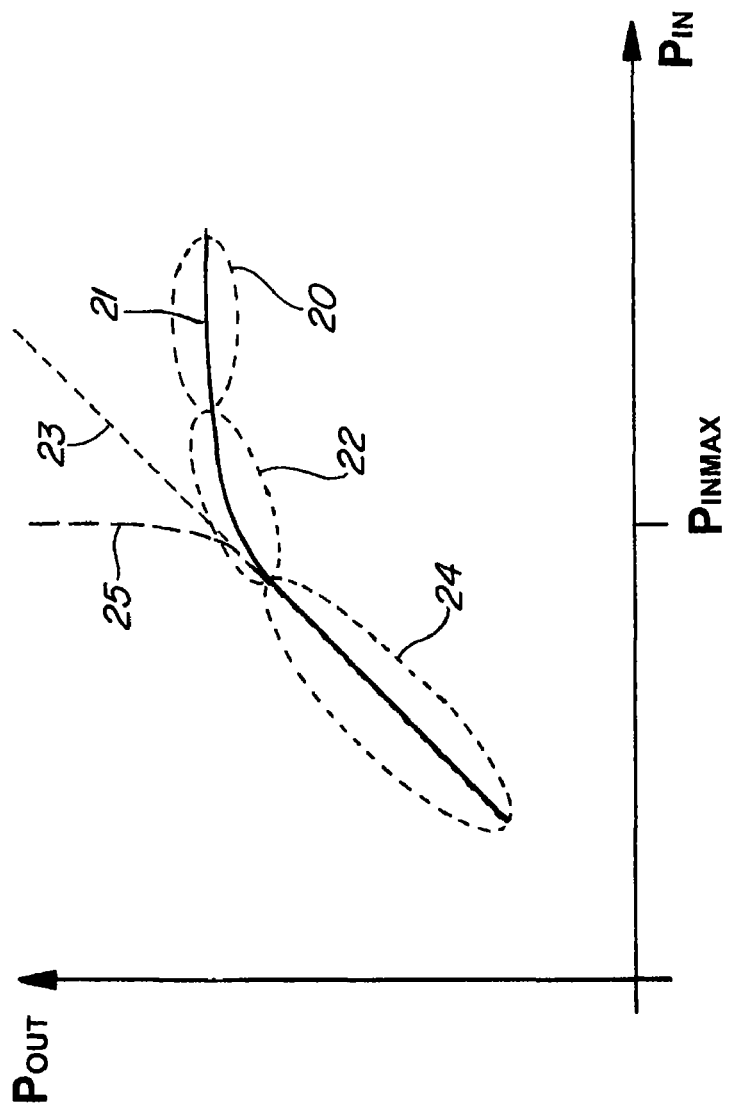
FIG. 3 is a graph illustrating the adjustment of the operating characteristic of a power amplifier.

FIG. 3, a graph of input power at the RF input port versus output power of a conventional power amplifier, shows a normal power characteristic curve 21. The power amplifier can operate in quadrature mode in its linear region 24. However, at high power ranges at the RF input port, the conventional power amplifier will operate in the saturation region 22 and compressed region 20.

The characteristic power curve 21 does not follow the ideal power curve 23 at medium to high power ranges. By preprocessing the input characteristics of the amplifier to generally follow the curve 25, the ideal performance of curve 23, can be approached.

Figure 4:
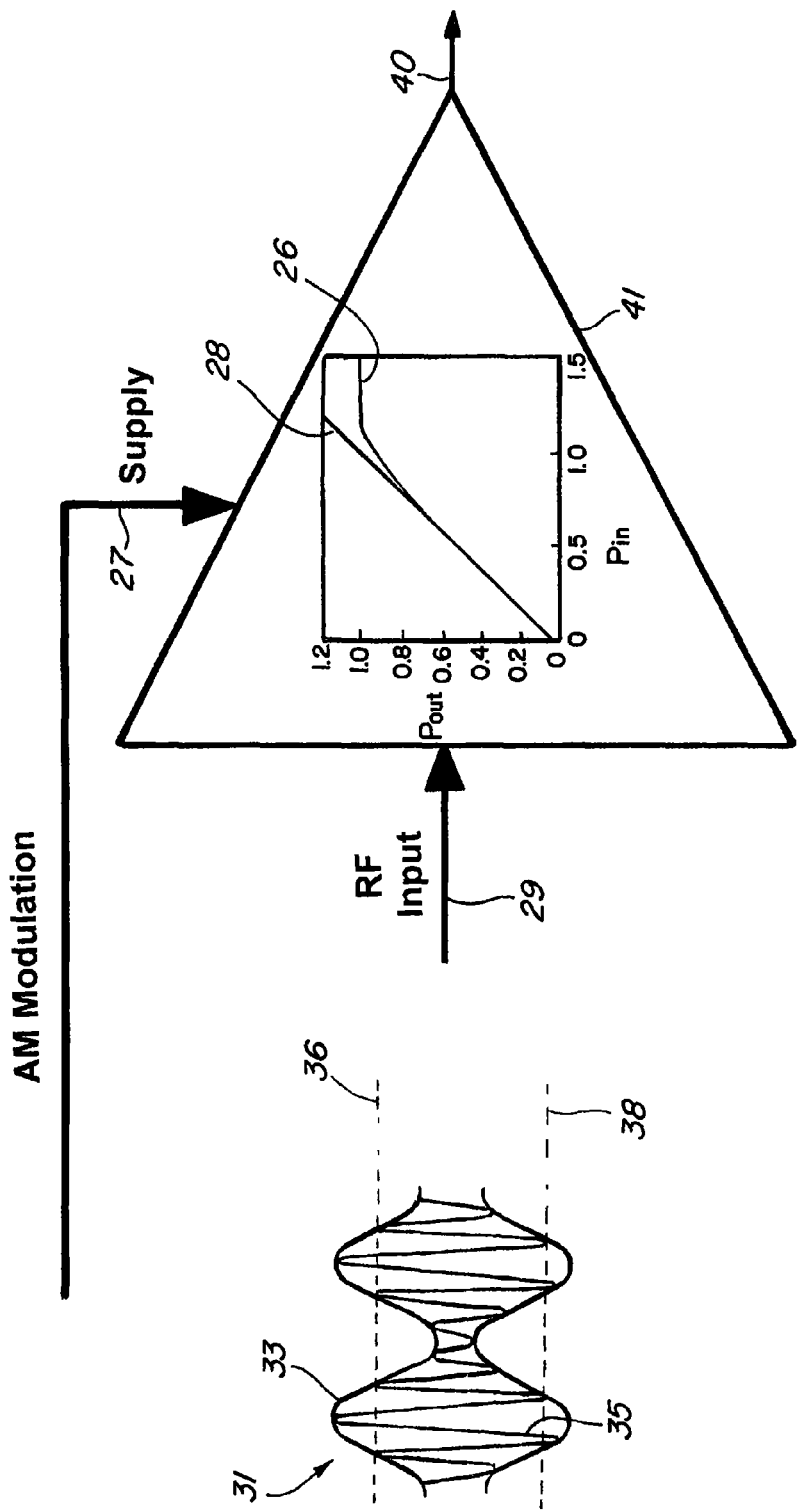
FIG. 4 is a schematic diagram of a power amplifier operating in an Envelope Reduction and Restoration ("ERR") mode.

A conventional power amplifier 41, as seen in FIG. 4, normally receives an amplitude modulated signal at a supply port 27 and a modulated RF signal at an RF input port 29 to generate an output signal 40. An envelope varying signal 31, must be processed by the amplifier 41. The signal 31 contains an amplitude component 33 and a phase component 35. The envelope 33 sweeps above and below the amplifier saturation levels 36 and 38.

Figure 5:
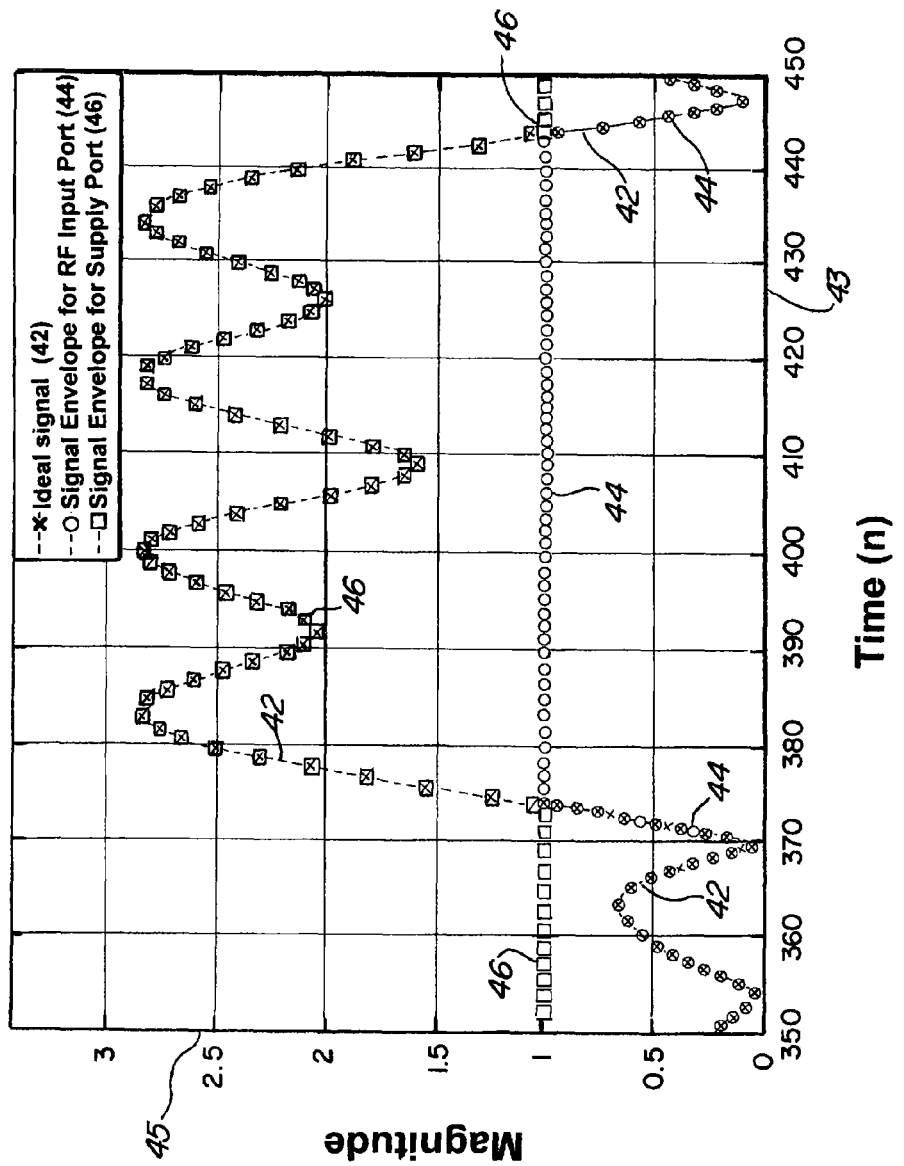
FIG. 5 is a graph showing how the envelope varying signal at the RF input port and the supply port combine when the amplifier is in the ERR mode.

The Pin versus Pout graph inside power amplifier 41 shows the characteristic. Curve 26 is the actual characteristic of the amplifier 41. Curve 28 is an ideal characteristic. To fit within the dynamic range of the amplifier, the magnitude of the RF input port signal 31 must be decomposed, as shown in FIG. 5. For example, the magnitude of an ideal signal 42 can be decomposed into an RF input port signal 44 and a supply port signal 46. The RF input port signal 44 tracks the ideal signal 42 until the magnitude of the ideal signal 42 is above a predetermined maximum. At this predetermined maximum, the RF input port signal 44 will stop tracking the ideal signal and maintain a constant level. In contrast, the supply port signal 46 maintains a constant level until the magnitude of the ideal signal 42 is above the maximum magnitude of the RF input port signal. The supply port signal 46 tracks the ideal signal 42 when it is above the maximum magnitude of the RF input port signal.

The ideal signal 42 is thereby decomposed into two signals, RF input port signal 44 and supply port signal 46, with the RF input port signal 44 tracking the ideal signal 42 below its maximum magnitude, and the supply port signal 46 tracking the ideal signal 41 above the RF maximum magnitude.

Figure 6:
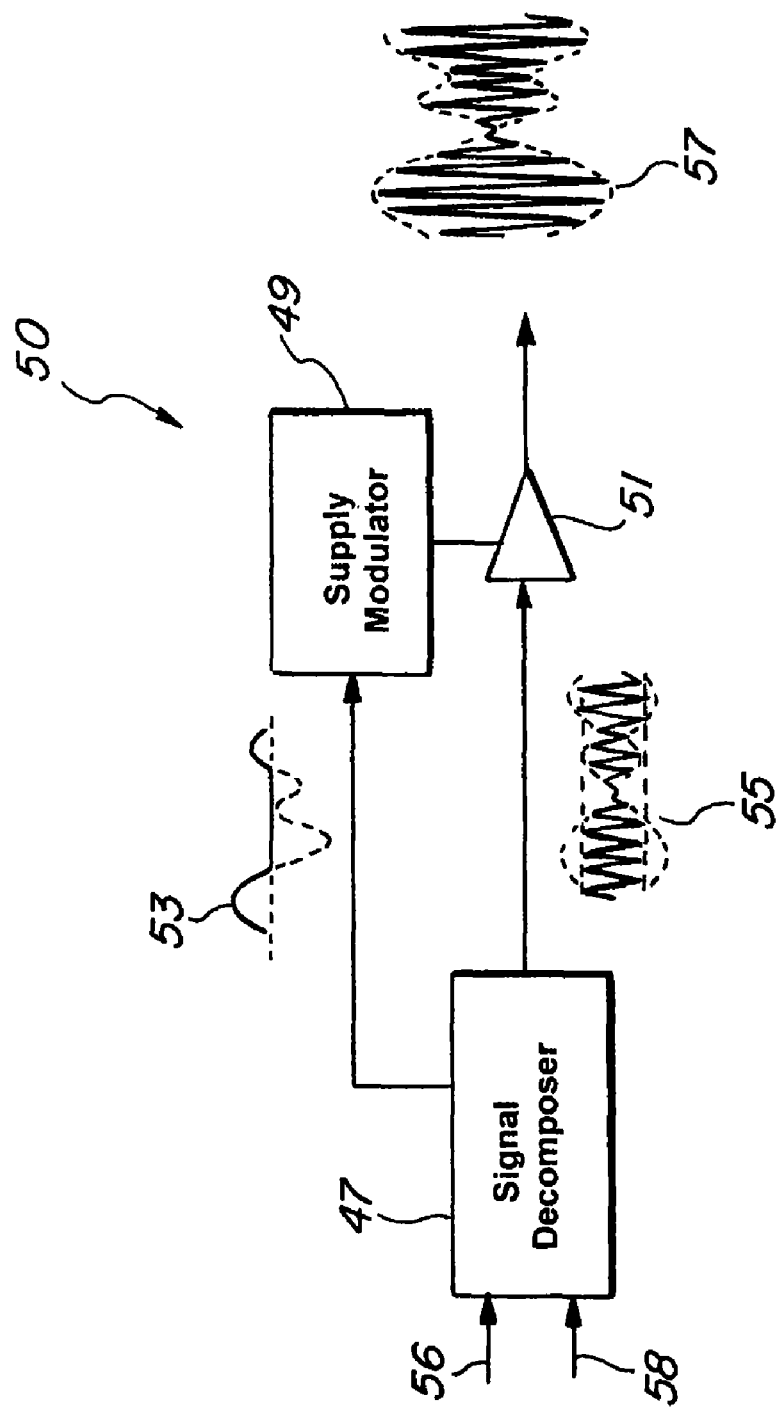
FIG. 6 is a block diagram of a power amplifier that operates with an envelope varying signal at both the RF input port and the supply port.

A conventional ERR transmitter 50 is shown in FIG. 6. A signal decomposer 47 receives a rectangular coordinate signal including an in-phase component 56 and a quadrature-phase component 58 and converts it into a polar coordinate signal including an amplitude component and a phase-component. The signal decomposer 47 transmits the amplitude component above a predetermined maximum level as the first component 53. The signal decomposer 47 converts the amplitude component below the predetermined maximum level and the phase-component into a modified rectangular coordinate signal as the second component 55.

A supply modulator 49 receives the first component 53, modulates it, and sends the resulting supply signal to the power amplifier 51. The second component 55 is sent to the RF input port of the amplifier 51. The power amplifier 51 thus generates the wide power band output signal 57.

Figure 7:
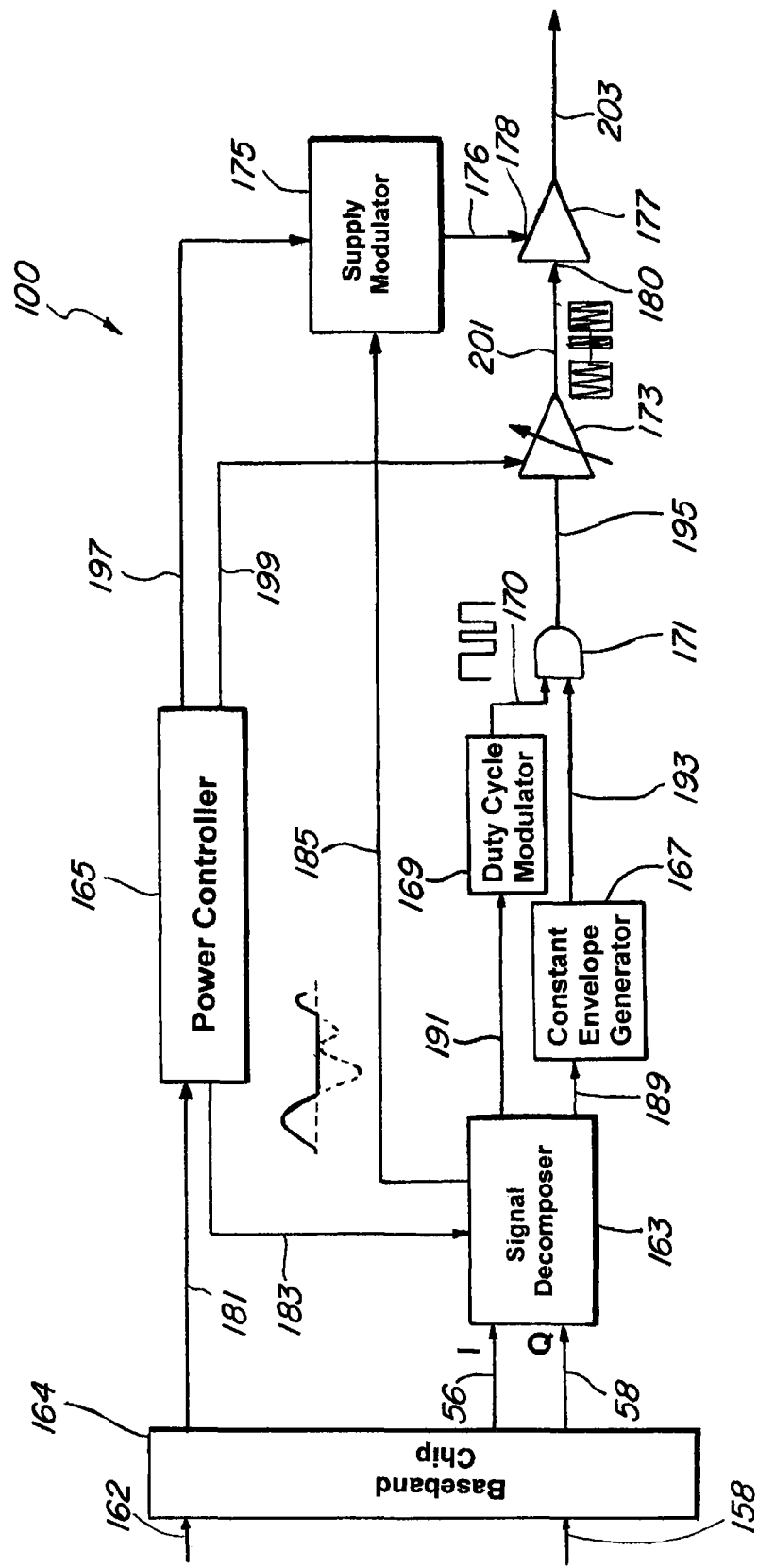
FIG. 7 is a block diagram of a preferred embodiment according to the present invention.

A transmitter 100, utilizing the present invention, is shown in FIG. 7. A baseband chip 164 receives a baseband information signal 162 from a base station (not shown). The baseband chip 164 extracts power level information from the baseband information signal 162 to generate a power level signal 181 indicating a desired power output of a power amplifier 177.

For example, when the baseband chip initially communicates with the base station, the baseband information signal 162 could indicate that the desired power output for the power amplifier 177 is 20 dBm. Subsequently, the base station could indicate in the baseband information signal 162 to increment or decrement the power output of the power amplifier 177.

The baseband chip also receives a data signal 158 from a data unit (not shown) representing the desired data to be transmitted such as voice information or image information. The baseband chip 164 generates rectangular coordinate signals including an in-phase component 56 and a quadrature-phase component 58 from the data signal 158.

A power controller 165 receives the power level signal 181 from the baseband chip 164, to indicate the desired power output of power amplifier 177. The power level signal 181 can be a digital signal and can indicate a low, medium, or high power range based on the desired power output of the power amplifier 177.

The baseband chip determines the power level signal 181 by communicating with a base station. For example, a base station can instruct a mobile phone containing the transmitter 100 to vary the power output of the power amplifier 177 based on a distance between the base station and the transmitter 100. Thus, if the mobile phone is located a large distance from the base station, then the base station can instruct the baseband chip to transmit the power level signal 181 indicating the high power range. However, if the mobile phone is located a short distance from the base station, then the base station can instruct the baseband chip to transmit the power level signal 181 indicating the low or medium power range.

Likewise, the base station can instruct the mobile phone to vary the power output of the power amplifier 177 based on the quality of the communications channel between the mobile phone and the base station. If the communications channel between the mobile phone and the mobile station is degraded, then the base station can instruct the baseband chip to transmit the power signal 181 indicating the high power range. However, if the communications channel between the mobile phone and the mobile station is acceptable or extremely clear, then the baseband chip can instruct the base station can instruct the baseband chip to transmit the power level signal 181 indicating the low or medium power range.

Responsive to the power level signal 181, the power controller 165 determines a threshold signal 183 for a signal decomposer 163, an amplification signal 199 for variable gain amplifier 173, and a gain signal 197 for supply modulator 175. The power controller determines the threshold signals and the gain signals by use of a look-up table (not shown) as directed by the power level signal 181. The power level signal 181 also determines a first predetermined power threshold and a second predetermined power threshold, which will be described later.

The signal decomposer 163 receives rectangular coordinate signals including an in-phase component 56 and a quadrature-phase component 58 and converts these signals into polar coordinate signals having an amplitude component and a phase component. The signal decomposer 163 decomposes the amplitude component into a first amplitude component 185 which is above a predetermined amplitude threshold, and a second amplitude component 191, which is below the predetermined amplitude threshold, and a phase component 189. Thus, the signal decomposer 163 prepares the first amplitude component 185, the second amplitude component 191, and the phase component 189, based on the in-phase component 56 and the quadrature-phase component 58. The predetermined amplitude threshold is established by threshold signal 183 supplied to decomposer 163 by power controller 165 based on the selected power output of the power amplifier 177.

The signal decomposer 163 transmits the first amplitude component 185 to a supply modulator 175. The supply modulator 175 receives the first amplitude component 185 and modulates it with a gain signal 197 from the power controller 165 to produce a supply signal 176. When the supply modulator 175 is active, such as when the power level signal 181 indicates that power output of the power amplifier 177 should be above the second predetermined power threshold, the supply modulator output signal 176 is a modulated supply signal. However, when the supply modulator is inactive, such as when the power level signal 181 indicates that output power of the power amplifier 177 should be below the second predetermined power threshold, the supply modulator output signal 176 is merely a constant level signal since the first amplitude component 185 is a constant level signal.

A constant envelope signal generator 167 receives the phase component 189 of the polar coordinate signal from the signal decomposer 163 and generates a constant envelope phase indicating signal 193 which is transmitted to a combining unit 171, which may be an AND gate.

The duty cycle modulator 169 receives the second amplitude component 191 of the polar coordinate signal from the signal decomposer 163 and modulates the second amplitude component 191 on to a pulse signal to produce a duty cycle modulator output signal 170 which is transmitted to the combining unit 171. The duty cycle modulation could be, for example, a type of pulse width density modulation such as ΔΣ modulation wherein the amplitude variations of signal 191 is represented by the pulse widths of the output signal 170. When the power level signal 181 indicates that power output of the power amplifier 177 should be below the first predetermined power threshold, the duty cycle modulator is active. When the power level signal 181 indicates that power output of the power amplifier 177 should be above the first predetermined power threshold, the duty cycle modulator is inactive. The duty cycle modulator output signal 170 is then a constant level signal.

The combining unit AND gate 171 receives the duty cycle modulator output signal 170 and the signal 193 from the constant envelope generator 167 to form a signal 195. The signal 195 is high or "ON" during a period when both the constant envelope signal 193 and the duty cycle modulator output signal 170 are high or "ON." The combined signal 195 is low or "OFF" during the period that one of the input signals is low. If the duty cycle modulator output signal 170 is constantly high, or "ON" because the duty cycle modulator 169 is inactive, then the signal 195 from combined AND gate 171 is merely the constant envelope signal 193. The signal 195 is transmitted to a variable gain amplifier 173.

The variable gain amplifier 173 amplifies the signal 195 based on the amplification signal 199 from the power controller 165 to generate an amplified signal 201. The amplification of signal 195 is adjusted to the desired power range as directed by amplification signal 199 from power controller 165. The amplified signal 201 is supplied to a power amplifier 177.

The power amplifier 177 includes a supply port 178 and an RF input port 180. The supply port 178 receives the supply signal 176 from supply modulator 175. The RF input port 180 receives the amplified signal 201 from the variable gain amplifier 173. The power amplifier 177 uses signal 201 at the RF input port and the supply signal 176 at the supply port to form a power output signal 203.

The path from the signal decomposer 163 to the supply port 178 of power amplifier 177 is the amplitude path. The path taken from the signal decomposer 163 to the RF input port 180 of the power amplifier 177 is an RF input port path.

The power amplifier 177 is set up to operate in three modes, the EER mode, the DCM ERR mode, and the DCM mode, depending on the selected power output of the power output signal 203 as indicated by the power level signal 181. The power amplifier 177 operates in the EER mode when the power level signal 181 indicates the high power range. The power level signal 181 causes the power controller to direct when the power amplifier operates in the EER mode. The power amplifier 177 operates in the DCM ERR mode when the power level signal 181 indicates the medium power range. The power level signal 181 causes the power controller to direct when the power amplifier operates in the DCM ERR mode. The power amplifier 177 operates in the DCM mode when the power level signal 181 indicates the low power range. The power level signal 181 causes the power controller to direct when the power amplifier operates in the DCM mode.

When the power amplifier 177 is operating in the EER mode during high power ranges, the supply modulator 175 is active and the duty cycle modulator 169 is inactive. With only the supply modulator 175 active, only supply signal 176 is provided to the power amplifier 177 at supply port 178. The supply signal 176 contains the entire amplitude component. The amplified signal 201 at the RF input port of power amplifier 177, at high power ranges, is a constant envelope signal, as the result of the constant envelope signal 193 being passed through combiner unit 171. When the duty cycle modulator 169 is inactive, the duty cycle output signal 170 is a constant high or "ON." With a high at one of its inputs the combiner AND gate unit 171 passes the constant envelope signal 193 on its other input to amplifier 173 unaltered. During high power ranges, the power amplifier 177 operates in the compressed region using polar modulation. This provides low, out of band noise. Because the duty cycle modulator 169 is inactive, a surface acoustic wave ("SAW") filter which is normally required to reduce interference to external electronic devices is not needed.

When power output of the power amplifier 177 is selected to be at medium power ranges, the DCM ERR mode is used. In this mode, the supply modulator 175 and the duty cycle modulator 169 are both active. The output signal 176 from supply modulator 175 is provided to supply port 178 of the power amplifier 177. With the duty cycle modulator 169 active, the amplified combined signal 201 received by the power amplifier at the RF input port 180 includes the constant envelope signal 193 and the duty cycle modulated signal 170.

When the power amplifier 177 is operating in the DCM mode wherein power output of the power amplifier 177 is selected to be at low power ranges, the supply modulator 175 is inactive and the duty cycle modulator 169 is active. With the supply modulator 175 inactive, the output signal 176 is a constant level signal. Since the duty cycle modulator 169 is active, the amplified combined signal 201 includes components of both the duty cycle modulated signal 170 and the constant envelope signal 193.

The supply modulator 175 operates similar to open loop polar supply modulation at high and medium power ranges. During low power ranges, the supply modulator 175 provides a constant level voltage signal to power amplifier 177. The level of the voltage signal depends on power indicator signal 181. During low power ranges, the dithering frequency of duty cycle modulator 169 is a function of the power level signal 181. During low power ranges, the variable gain amplifier 173 and the power amplifier 177 function similar to attenuators.

The predetermined amplitude threshold and the first and second predetermined power thresholds are controlled by threshold indicating signal 183 from power controller 165. The variable amplification amount is controlled by the amplification signal 199. The gain signal 197 is controlled by the first and second predetermined power thresholds based on performance matrices regarding the adjacent channel leakage ratio specifications ("ACLR") and received band ("Rx") noise specifications. For example, the first and second predetermined power thresholds can be based on performance matrices regarding ACLR 5, ACLR 10, and Rx noise specifications at a 45 MHz offset ("Rx 45").

ACLR is the ratio of a root-raised cosine ("RRC") filtered mean power centered on an assigned channel frequency to the RRC filtered power centered on an adjacent channel frequency. The ACLR 5 and the ACLR 10 measure a relative power at ±5 MHz and ±10 MHz offsets from an uplink channel such as output signal 203. ACLR measurements and more specifically ACLR 5 and ACLR 10 measurements are defined in the 3rd Generation Partnership Project ("3GPP") Technical Specification ("TS") 34.121, sections 5.10 and 5.10A, which is incorporated herein in its entirety. Rx 45 is the receive band noise specification at a 45 MHz offset to avoid desensitization of the receiver. Since a mobile phone utilizing the transmitter 100 may spend most of its time at medium power ranges, the energy savings at the medium power range can be a large amount of energy savings.

The following Table 1 discloses noise level when comparing EER to DCM ERR at a power output level of 6 dBm for power amplifier 177.

TABLE 1

| | ACLR 5 (dBc) | ACLR 10 (dBc) | Rx 45 (dBm/100 KHz) |
| --- | --- | --- | --- |
| 3GPP | −33 | −43 | (N/A) |
| Target Specification | −46 | −52 | −66.8 |
| EER mode | −46.2 | −52.8 | −93.3 |
| DCM ERR mode | −50.7 | −67.0 | −79.8 |

From Table 1, the EER mode and the DCM ERR mode are both below the target specification and the 3GPP specification. Both the EER mode and DCM ERR mode are thus acceptable modulation modes for the power amplifier 177. However, at some power level, the EER mode will have an unacceptable noise level as compared to the DCM ERR mode. The power amplifier 177 switches to operate in the DCM ERR, before the EER mode reaches an unacceptable noise level. Similar tables to Table 1 can be created for a spectrum of power output ranges to determine the transition points for the power amplifier 177, from the EER mode to the DCM ERR mode, and to the DCM mode.

Figure 8:
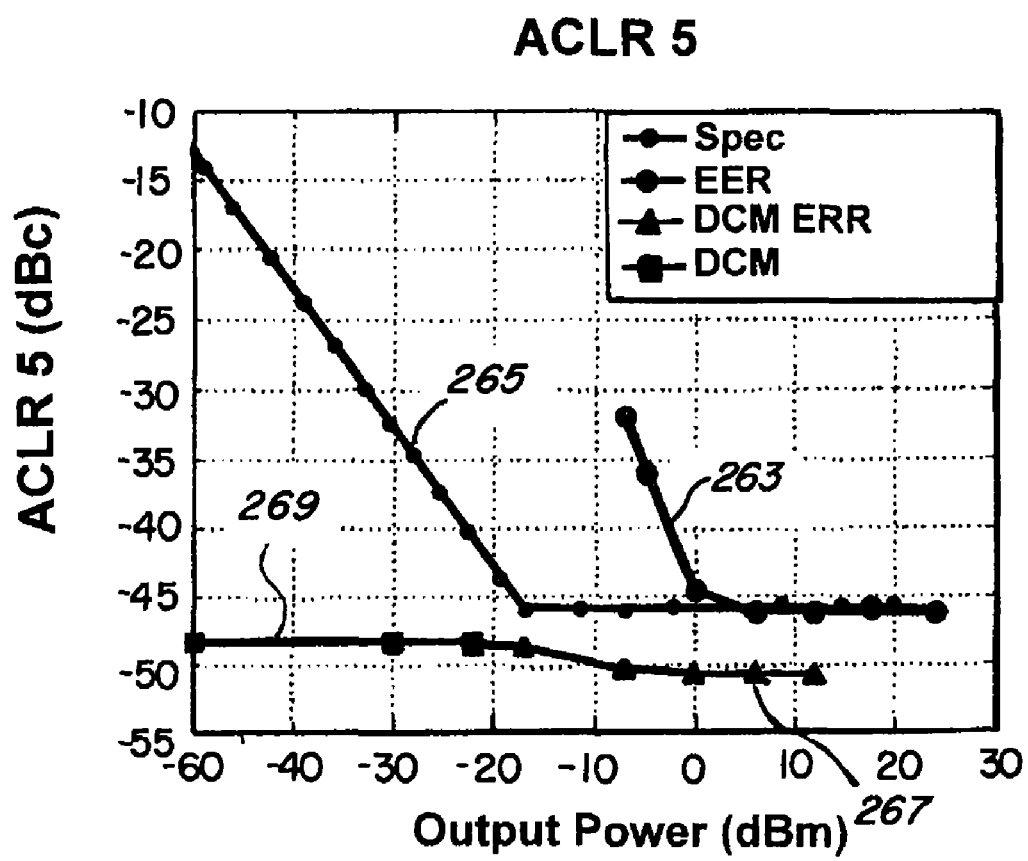
FIG. 8 is a graph of the specification for Adjacent Channel Leakage Ratio 5 (ACLR5) showing the use of three operating modes for a power amplifier to match the specification.

In FIG. 8, an ACLR 5 target specification is compared to operation of the power amplifier in the EER mode, the DCM ERR mode, and the DCM mode. The target specification, represented by curve 265 is matched as closely as possible by operating the power amplifier in the EER mode 263 at high power ranges, operating the amplifier in the DCM ERR mode 267 at medium power ranges, and operating the power amplifier in the DCM mode 269 on low power ranges.

Figure 9:
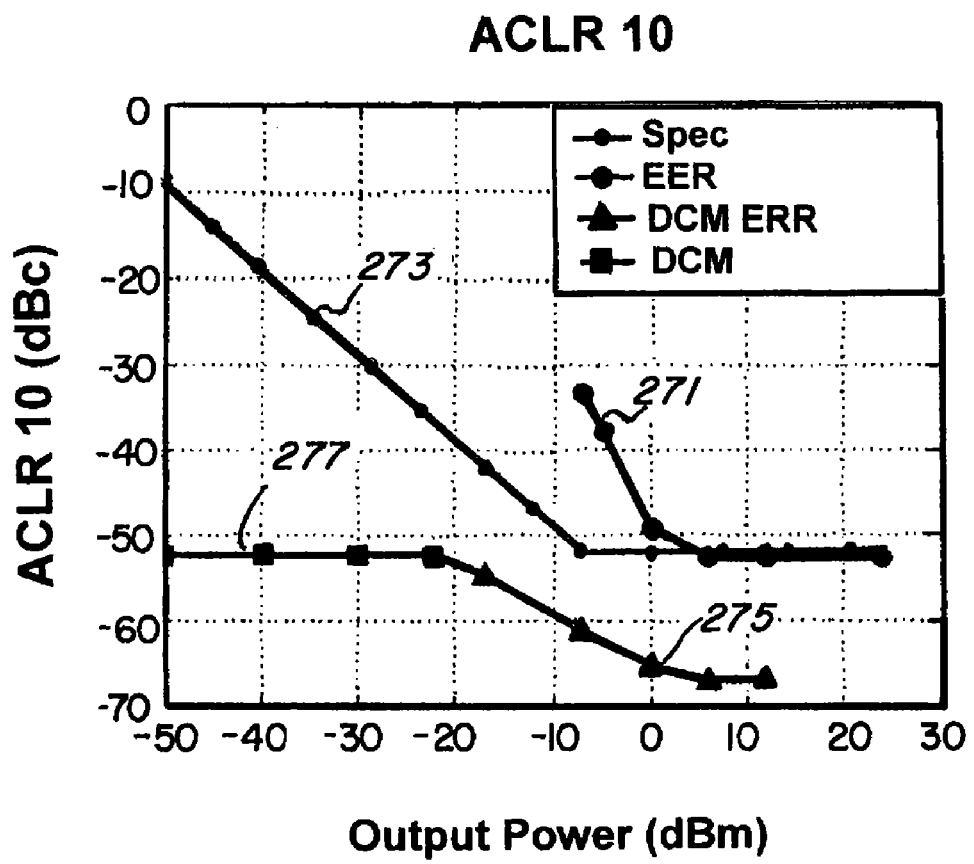
FIG. 9 is a graph of the specification for Adjacent Channel Leakage Ratio 10 (ACLR10) showing the use of three operating modes of a power amplifier to match the specification.

In FIG. 9, an ACLR 10 target specification is compared to operation of the amplifier in the EER mode, the DCM ERR mode, and the DCM mode. The target specification represented by curve 273 is matched as closely as possible by operating the power amplifier in the EER mode 271, at high power ranges, operating the power amplifier in the DCM ERR mode 275 at medium power ranges, and operating the power amplifier in the DCM mode 277 at low power ranges.

Figure 10:
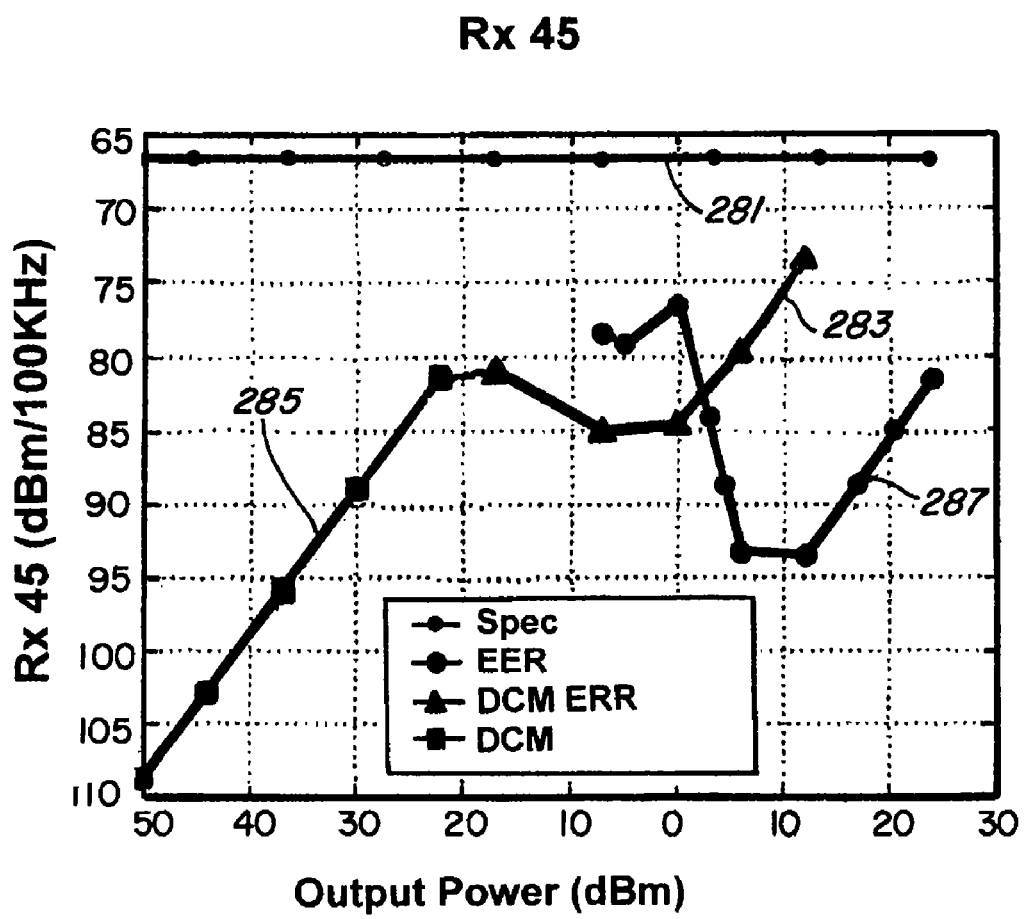
FIG. 10 is a graph of the specification receive band noise at a 45 MHz offset (Rx 45) showing use of three operating modes of a power amplifier to match the specification.

In FIG. 10 an Rx 45 target specification is compared to operation of the amplifier in EER mode, DCM ERR mode, and DCM mode. The target specification represented by curve 281 is matched as closely as possible by operating the power amplifier in the EER mode 287 at high power ranges, operating the power amplifier in the DCM ERR mode 283 at medium power ranges, and operating the power amplifier in the DCM mode 285 at low power ranges.

Based on FIG. 8, FIG. 9, FIG. 10, and Table 1, transition points for switching between EER mode, DCM ERR mode, and DCM mode of operation for the power amplifier can be selected so the power amplifier operates within the specification. For example, the point for the DCM ERR mode to transition to the EER mode can be selected to be between 6 dBm to 24 dBm because the EER mode has an ACLR 5, ACLR 10, and Rx 45 noise below the target specification in that power range. Below 6 dBm, however, the EER mode has an ACLR 5 and ACLR 10 noise above the target specification. Although the EER mode still has acceptable noise for the specification, the EER mode should preferably have acceptable noise levels in the ACLR 5, and the ACLR 10 specifications as well.

The point for the DCM mode or the EER mode to transition to the DCM ERR mode can be selected to be between −22 dBm to 12 dBm because during those ranges the DCM ERR mode is below the target specification in the ACLR 5, ACLR 10, and Rx 45 noise specification. The point for the DCM ERR mode to transition to the DCM mode can be selected to be between −50 dBm to −22 dBm since the DCM mode operates below the target specification at that range in the ACLR 5, ACLR 10, and Rx 45.

Thus, the first predetermined power threshold for operating in the high power ranges can be selected to be greater than 6 dBm, with a range between 6 dBm to 24 dBm. The power amplifier operates in the EER mode above this power threshold. The power amplifier 177 operates in the DCM mode when power output of the power amplifier is selected to be below a second predetermined power threshold in the low power range. The second predetermined power threshold can be selected to be less than −22 dBm, with a range between −50 dBm to −22 dBm. At low power ranges, receive ("Rx") band noise is not an issue and power is conserved to meet ACLR 5 and ACLR 10 requirements.

The power amplifier 177 operates in the DCM ERR mode when the power output of the power amplifier is selected to be at medium power ranges between the first predetermined power threshold and the second predetermined power threshold. In this range, the power output of the power amplifier is in the range of about −22 dBm to 12 dBm.

During medium power ranges, the RX band noise requirement is relaxed and the supply modulator 175 has a reduced dynamic range when compared to the high power ranges. Also, the power amplifier 177 can provide a good fit to ACLR 5 and ACLR 10 specifications when it operates with limited dynamic range from the supply modulator 175.

In the above described example, the 3GPP specification was used to determine the transition points for the EER mode, the DCM ERR mode, and the DCM mode of the power amplifier 177. However, other specifications for Global System for Mobile Communications ("GSM"), Enhanced Data Rate for GSM Evolution ("EDGE"), Code division multiple access ("CDMA"), Time division multiple access ("TDMA"), and other wireless specifications may be used to determine the transition points for the EER mode, the DCM ERR mode, and the DCM mode of the power amplifier 177. Furthermore, the predetermined amplitude threshold is selected such that when the power level signal 181 indicates a low power range wherein power output of the power amplifier 177 is selected to be below the second predetermined power threshold, the first amplitude component 185 is a constant level signal; and when the power level signal 181 indicates a high power range, wherein power output of the power amplifier 177 is selected to be above the first predetermined power threshold, the second amplitude component 191 is a constant signal.

Figure 11:
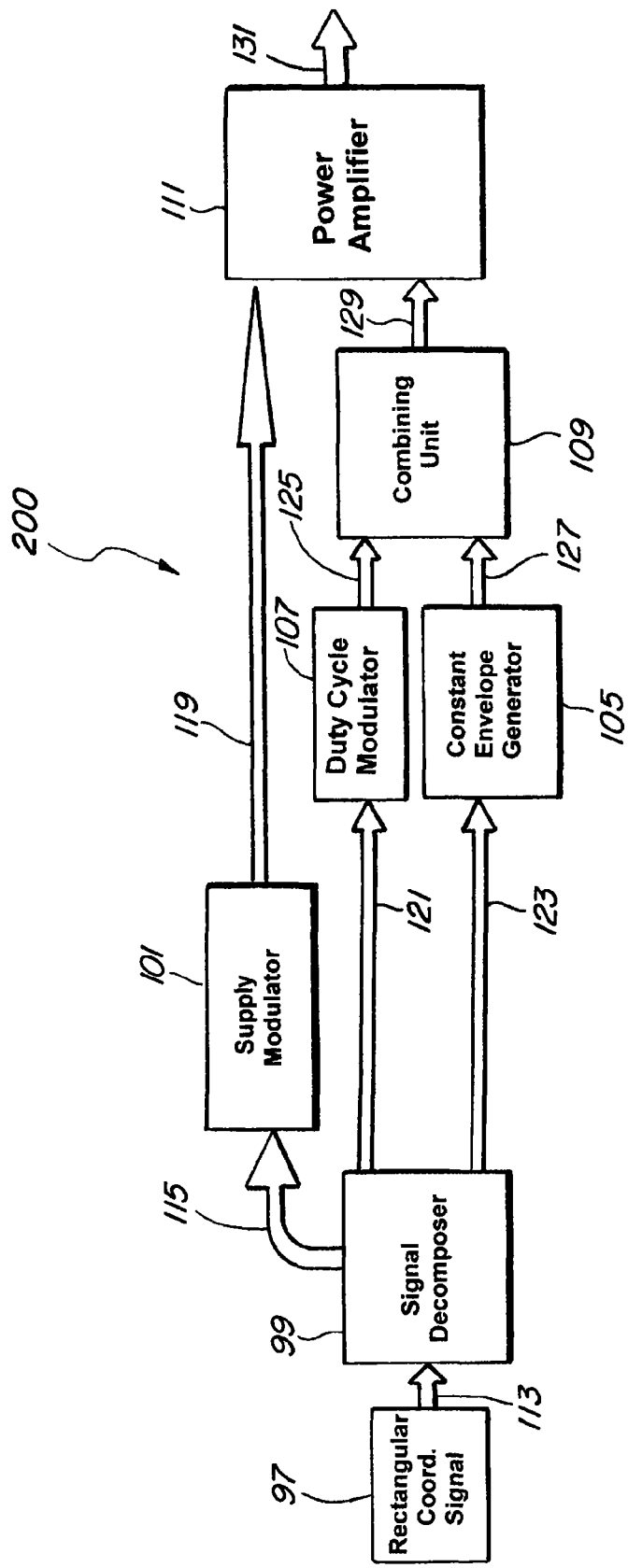
FIG. 11 is a block diagram illustrating signal flow in an embodiment of the present invention.

FIG. 11 is a block diagram illustrating signal flow for a preferred embodiment of a transmitter 200 according to the present invention. A rectangular coordinate signal generator 97 generates a rectangular coordinate signal 113 which is transmitted to a signal decomposer 99.

The signal decomposer 99 converts the rectangular coordinate signal into a polar coordinate signal, including an original amplitude component and a phase component 123. The signal decomposer 99 separates the original amplitude component into a first amplitude component 115 which is above a predetermined amplitude threshold, and a second amplitude component 121 which is below the predetermined amplitude threshold. The first amplitude component 115 is provided to a supply modulator 101. The second amplitude component 121 is provided to a duty cycle modulator 107. The phase component 123 is provided to a constant envelope generator 105.

The supply modulator 101 provides a supply signal 119 to the power amplifier 111. When the supply modulator 101 is active, the supply signal 119 is a modulated signal. When the supply modulator 101 is inactive, the supply signal 119 is a constant level signal.

A duty cycle modulator 107 provides a duty cycle modulated signal 125 to a combining unit 109. When the duty cycle modulator 107 is active, the signal 125 is a modulated signal. When the duty cycle modulator 107 is inactive, the signal 125 is a constant high level, or "ON."

A constant envelope signal generator 105 receives the phase component signal 123 and generates a constant envelope phase indicating signal 127, which is transmitted to the combining unit 109. The combining unit 109 receives the duty cycle signal 125 and the constant envelope signal 127 and forms a combined signal 129. The combined signal 129 is provided to the RF input port of the power amplifier 111. The power amplifier 111 receives the supply 119 and the combined signal 129 and generates a power output signal 131.

Figure 12:
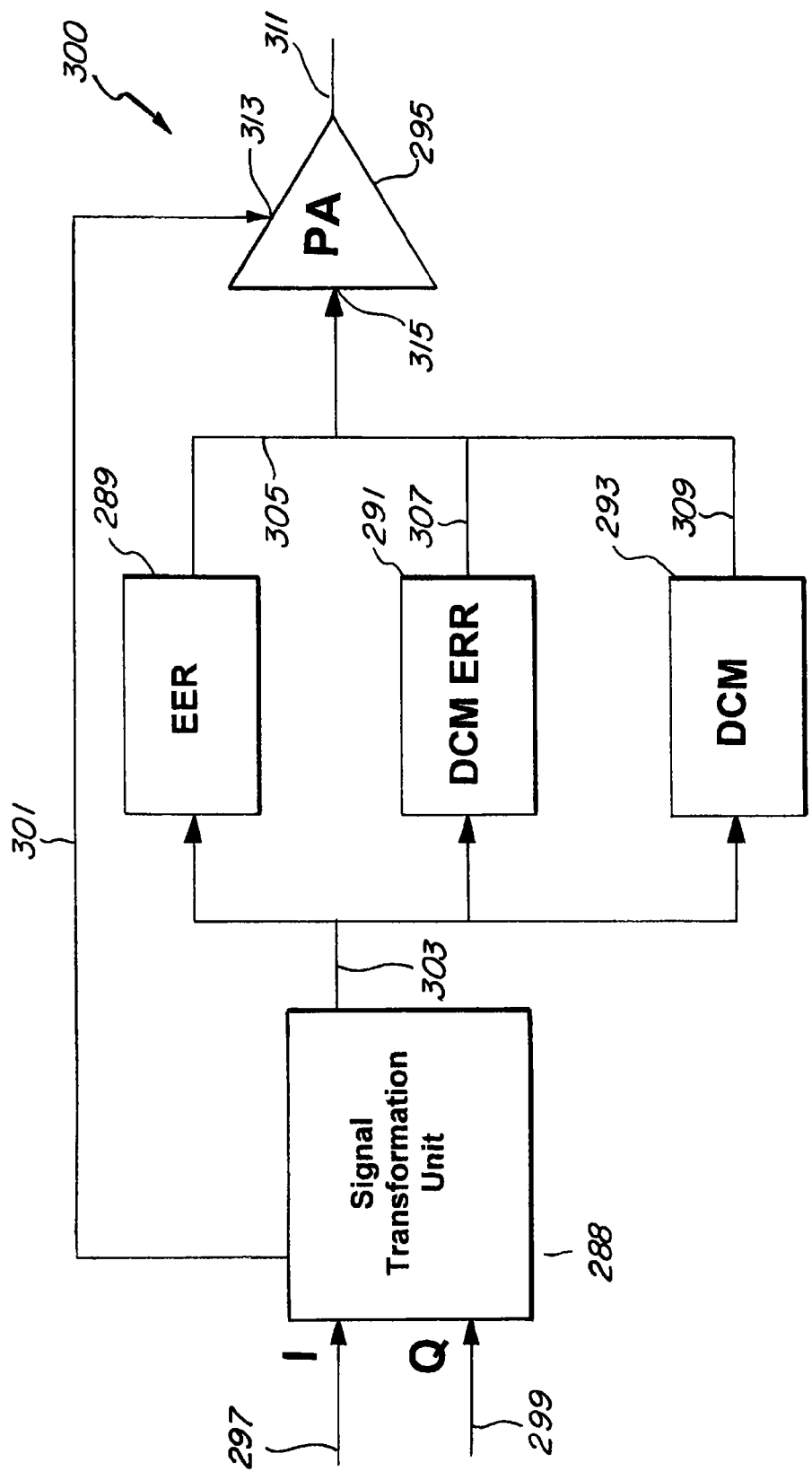
FIG. 12 is a block diagram illustrating the three basic modes of operation of an amplifier according to the present invention.

A transmitter 300, according to the present invention, specifically operates in the manner illustrated in FIG. 12. A signal transformation unit 288 receives a rectangular coordinate signal with an in-phase component 297 and a quadrature-phase component 299. The signal transformation unit 288 converts the rectangular coordinate signal into a polar coordinate signal and separates the polar coordinate signal into a first signal 301 and a second signal 303. The first signal 301 is transmitted to the supply port of a power amplifier 295. The second signal 303 is transmitted to an EER function unit 289, a DCM ERR function unit 291, and the DCM function unit 293. The first signal 301 can be either a modulated first amplitude component of the polar coordinate signals above a predetermined power threshold or a constant level signal. The second signal 303 includes the second amplitude component of the polar coordinate signal below the predetermined threshold and the phase component of the polar coordinate signal.

At high power ranges, the signal transformation unit 288 transmits the first signal 301 to the supply port of the power amplifier and the EER function unit 289 transmits a constant envelope signal 305 to the RF input port 315 of power amplifier 295. At high power ranges, the first signal 301 is a modulated first amplitude component.

At medium power ranges, the signal transformation unit 288 transmits the first signal 301 to the supply port 313 of the power amplifier 295, and the DCM ERR function unit 291 transmits a combined signal 307 to the RF input port 315 of the power amplifier 295. At medium power ranges, the first signal 301 is a modulated first amplitude component and the combined signal 307 includes the phase component of the signal 303 and a duty cycle modulated second amplitude component.

At low power ranges, the signal transformation unit 288 transmits the first signal 301 to the supply port 313 of the power amplifier 295, and the DCM function unit 293 transmits the combined signal 309 to the RF input port 315 of the power amplifier 295. The first signal 301 is a constant level signal. The combined signal 309 includes the phase component of the signal 303 and a duty cycle modulated second amplitude component.

Figure 13:
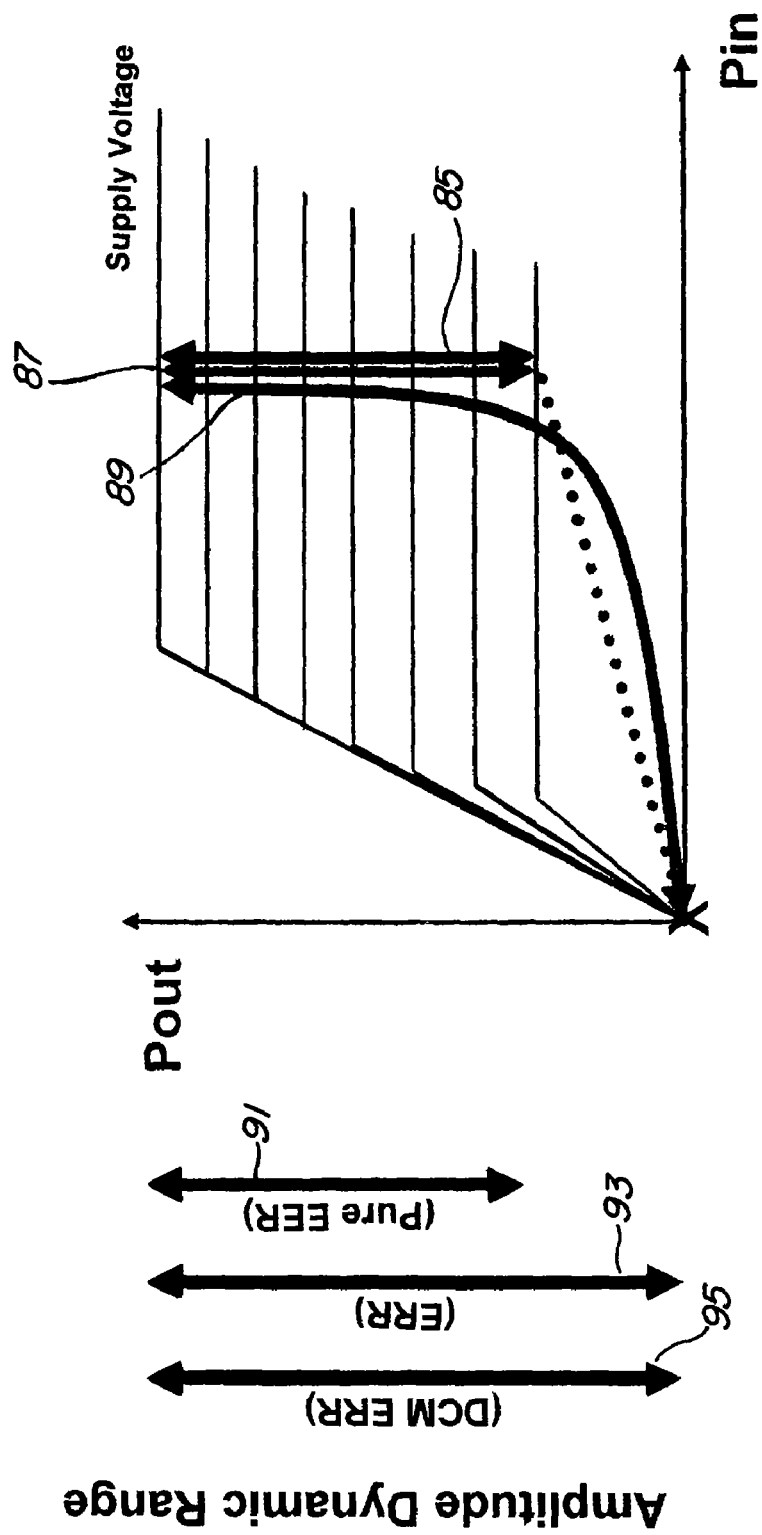
FIG. 13 is a graph comparing supply signal and amplitude dynamic range requirement for three different operating modes.

Advantageously, the present invention allows for a greater amplitude dynamic range when compared with a conventional EER or polar approach. FIG. 13 depicts various supply voltages plotted as power input versus power output. A power amplifier utilizing only polar or pure EER modulation has an operation curve shown by plot 85 and a corresponding amplitude dynamic range shown by plot 91. The amplitude dynamic range is limited by the dynamic range of the supply port at the power amplifier. A power amplifier utilizing ERR modulation, such as the conventional power amplifier 51 discussed above, uses an operational curve as shown by plot 89 with the corresponding amplitude dynamic range shown by line 93. Although the amplitude dynamic range is achievable, a feedback loop is required to ensure proper signal combination while transitioning the power amplifier between the compressed region and the linear region. As seen by the curve 89 between the origin and the last line of the supply voltage, the power amplifier operates in the linear region. A power amplifier utilizing DCM ERR mode, such as the power amplifier 177 (FIG. 7) or the power amplifier 295 (FIG. 12) of the present invention, discussed above, uses a supply signal shown by the plot 87 with an amplitude dynamic range shown by line 95. The lower part of the amplitude signal and subsequently the lower part of the dynamic amplitude range is achieved through duty cycle modulation by a duty cycle modulator. The power amplifier 177 is either in a compressed region or inactive as indicated by the dotted line between the origin and the last line of the supply voltage. Thus, the power amplifier 177 is operating either in the compressed mode, or is inactive. This is highly efficient for power amplifier operation.

Figure 14:
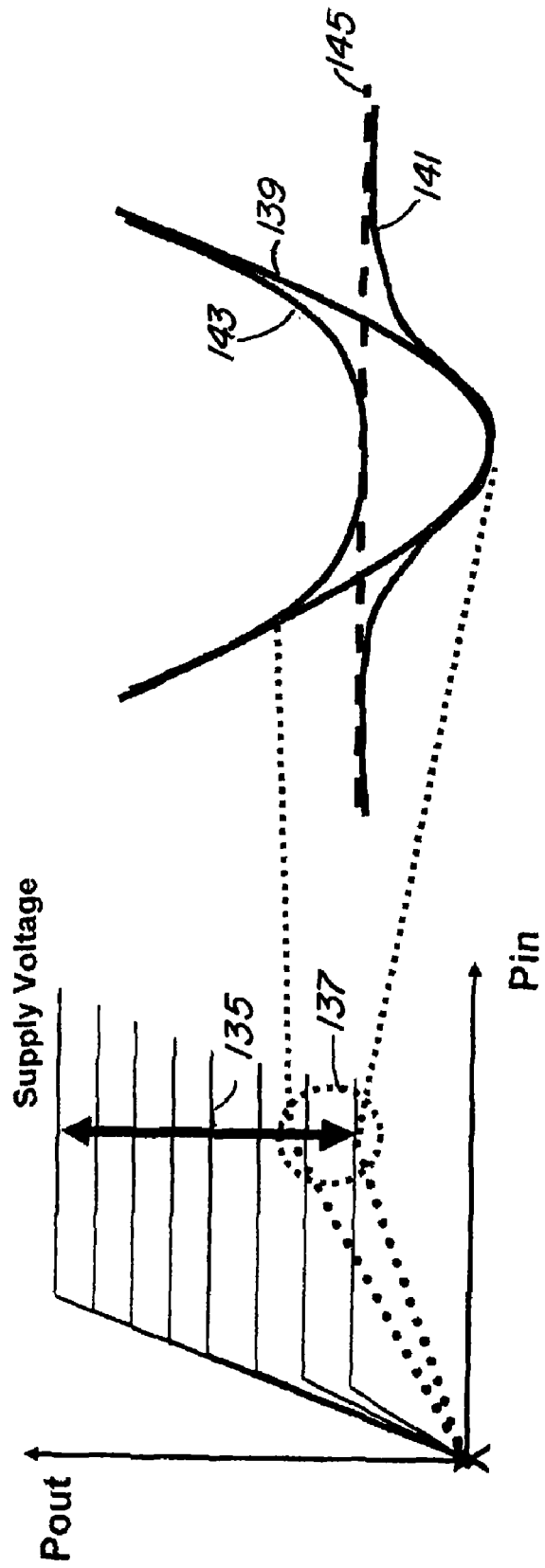
FIG. 14 is a graph illustrating separation of a polar coordinate signal into a first and second amplitude component according to the present invention.

A signal decomposer in a transmitter, such as the signal decomposer 163 in the transmitter 100 (FIG. 7) and/or a signal transformation unit such as the signal transformation unit 288 in the transmitter 300 (FIG. 12), can include a filter to filter the amplitude component of the polar coordinate signal and generate the first amplitude component and the second amplitude component. As seen in FIG. 14, curve 135 which is similar to curve 87 (FIG. 13) has a transition region 137. At transition region 137, an amplitude component 139 of the polar coordinate signal can be represented as a first amplitude component 143 and a second amplitude component 141.

The amplitude component 141 represents the amplitude component 139 below transition point 145. Amplitude component 143 represents the amplitude component 139 above the transition point 145. The transition point 145 is a predetermined amplitude threshold. The amplitude component 141 and the amplitude component 143 are curved in the transition area where the amplitude component 139 intersects with the transition point 145. This allows for smooth transition between the amplitude component 141 and the amplitude component 143. By having a smooth transition, the bandwidth required for the amplitude component 141 and the amplitude component 143 can be reduced which also reduces the over-sampling rate.

Figure 15:
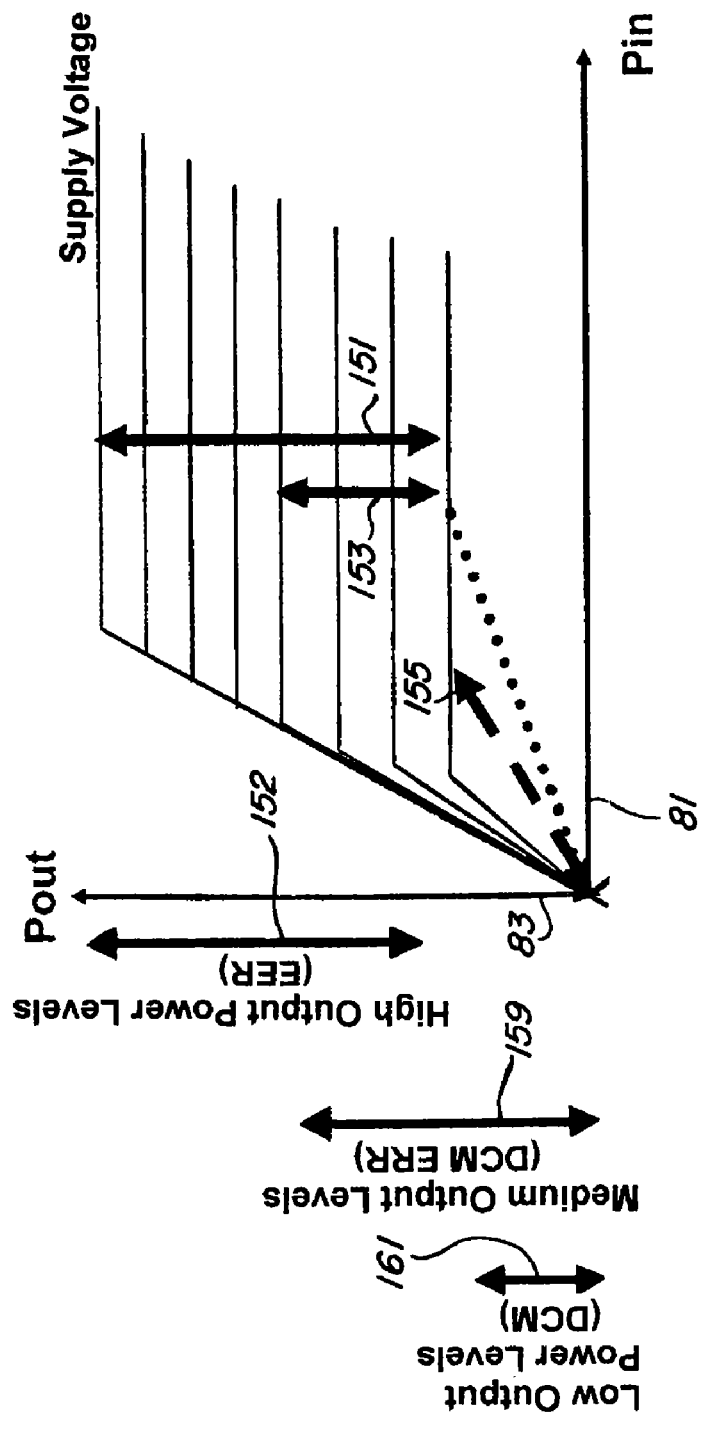
FIG. 15 is a graph illustrating three modes of operation of a power amplifier according to the present invention.

FIG. 15, includes various supply voltages plotted as a power input ("Pin") versus power output ("Pout") when a power amplifier is operating according to the present invention. With the power amplifier utilizing the EER modulation mode at high power ranges, the supply signal is shown as a curve 151 and the corresponding amplitude dynamic range is shown by line 152. During high power ranges, the power amplifier of the present invention utilizes a conventional polar operation where high efficiency is achieved by operating the power amplifier in the compressed region. This produces low out-of-band noise, because the duty cycle modulator is inactive. With the duty cycle modulator inactive, there is little to no interference with third party electronic devices which removes the need for using a SAW filter.

With a power amplifier operating in the DCM ERR mode, at medium power ranges, as in the present invention, the operation curve is shown by curve 153 and the corresponding amplitude dynamic range is shown by a line 159. In this mode, the transmitter is highly efficient because it is operating either in a compressed region or is inactive. Only low absolute out-of-band noise can occur because the power output of the amplifier is relatively low.

With a power amplifier operating in DCM mode at low power ranges, as in the present invention, the operation curve is shown by curve 155 and the amplitude dynamic range is shown by line 161. High efficiency is achieved at low power by deactivating the supply modulator and only utilizing the duty cycle modulator with a constant envelope generator. The duty cycle modulator dither frequency can be further reduced when the power output ranges are low.

Figure 16:
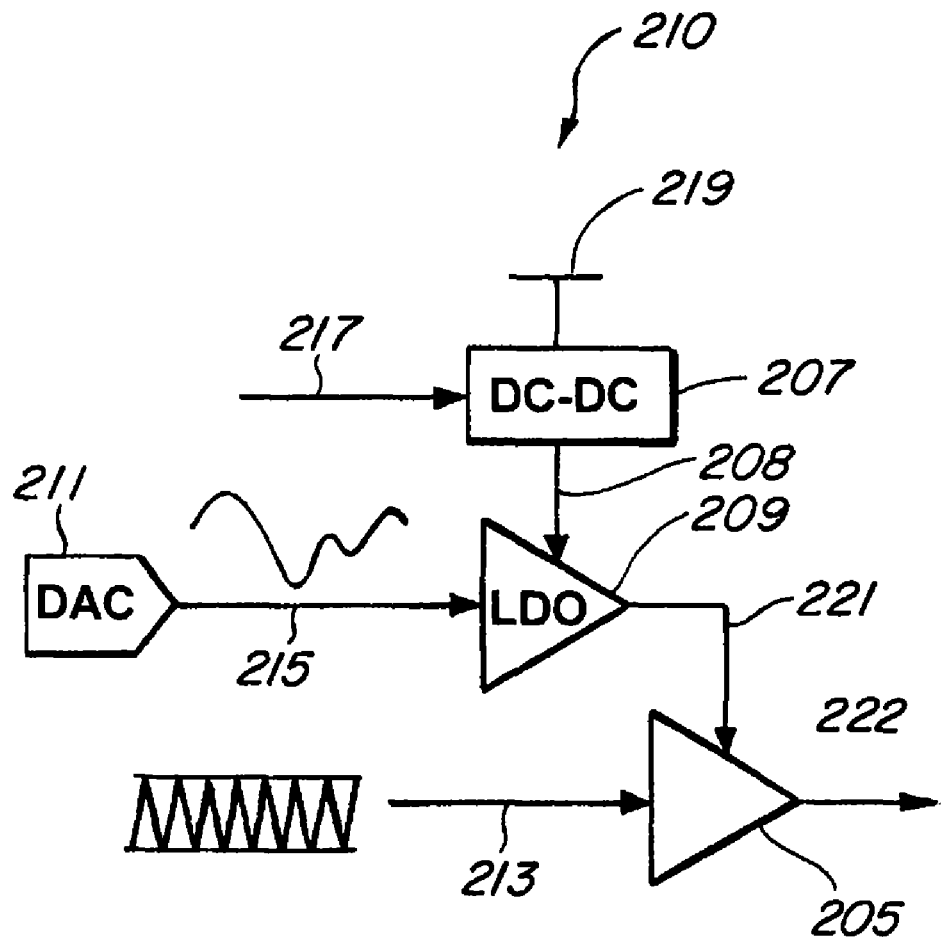
FIG. 16 is a block diagram of a power amplifier utilizing EER modulation at low power ranges.

FIG. 16 shows a conventional transmitter 210 at low power ranges. In the conventional transmitter 210 a DC-DC converter 207 receives a battery voltage 219 and a power level 217 and outputs a DC signal 208 to a low drop-out regulator ("LDO") 209. A digital-to-analog converter ("DAC") 211 transmits an amplitude component 215 to the LDO 209 in an amplitude path. The LDO 209 receives the amplitude component 215 and the DC signal 208 and outputs a signal 221 to the supply port of power amplifier 205. The power amplifier 205 receives a phase component 213 at an RF input port. The power amplifier 205 then utilizes the supply signal 221 and the phase component 213 to generate an output signal 222.

Figure 17:
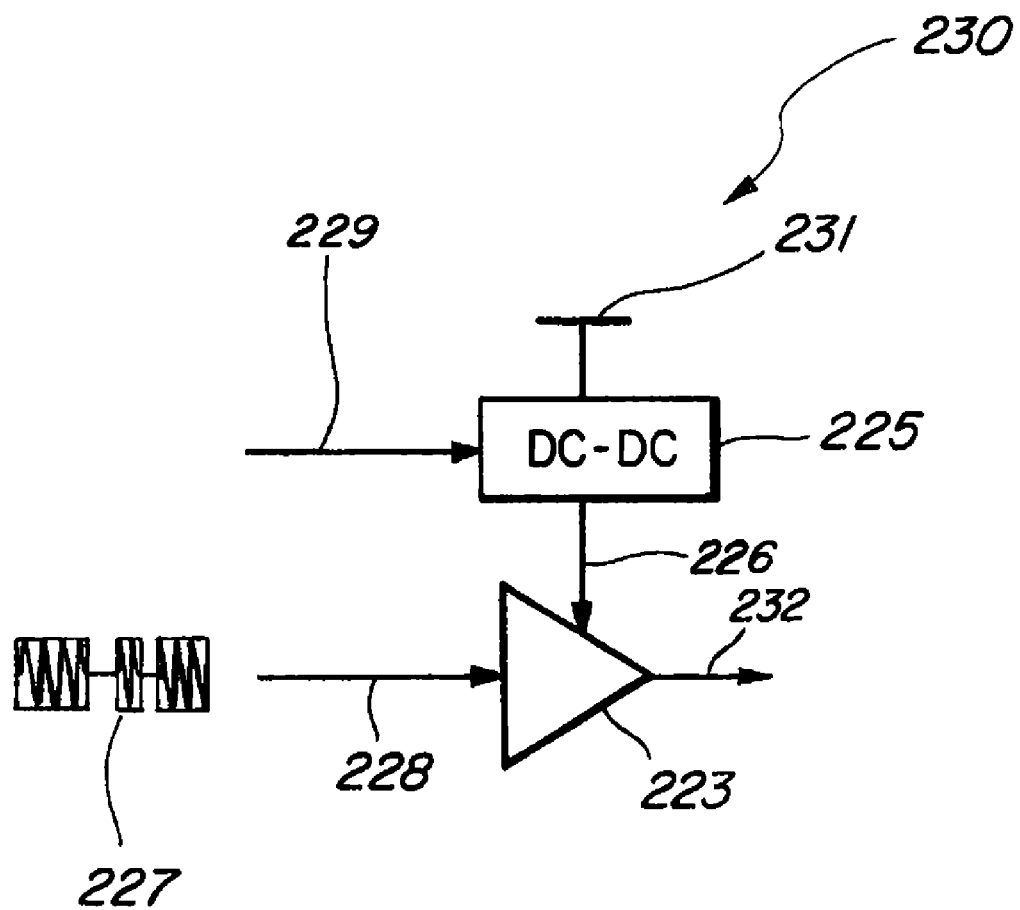
FIG. 17 is a block diagram of a power amplifier according to the present invention operating in a DCM mode at low power ranges.

FIG. 17 depicts a model of a transmitter 230 in a DCM mode according to the present invention, at low power ranges. A DC-DC converter 225 receives a battery voltage 231 and a power level 229 and outputs a DC signal 226 to the supply port of the power amplifier 223. The power amplifier 223 also receives a combined signal 228 at the RF input port. The combined signal 228 can include both amplitude and phase components 227. The amplitude component of the combined signal 228 is duty cycle modulated. The power amplifier 223 generates an output signal 232 from the DC signal 226 and the combined signal 228.

The transmitter 230 of the present invention utilizes less power than a conventional transmitter 210, even if the power amplifier 223 were to operate in its linear region at low power ranges because the amplitude path in the transmitter 230 would be shut down. Furthermore, the signal received at the supply port of the power amplifier 223 is a constant voltage. The constant voltage is directly provided by a highly efficient DC-DC converter 225. Thus, no LDO is required, eliminating the power loss associated with use of an LDO.

Figure 18:
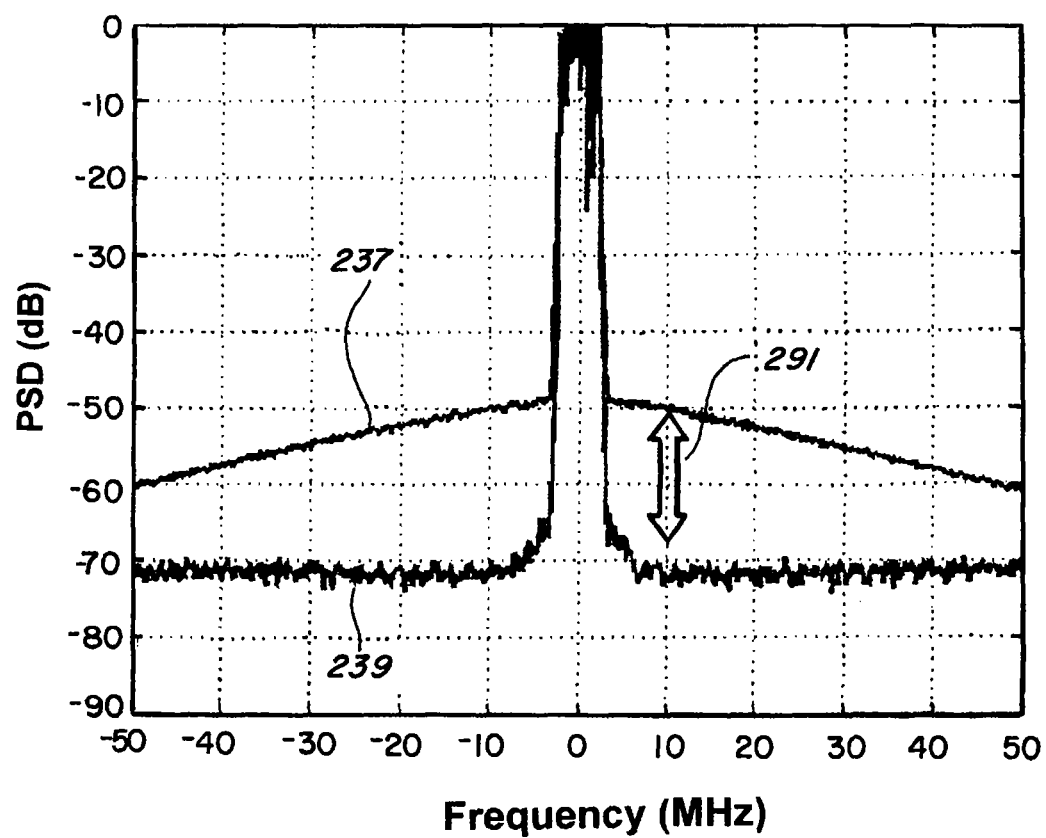
FIG. 18 is a graph of power spectral density comparison for a power amplifier operating in the EER mode and in the DCM ERR mode.

At medium power ranges, the power amplifier of the present invention operates in a DCM ERR mode. This is more efficient than conventional transmitters using power amplifiers operating in pure EER mode. As seen in a graph of power spectral density ("PSD") over frequency in FIG. 18, a PSD curve 239 of the power amplifier of the present invention exhibits lower PSD distribution over a larger number of frequencies as compared to a PSD curve 237 of the EER power amplifier. The improvement is shown, for example, by an arrow 291 indicating the difference in PSD distributions.

Figure 19:
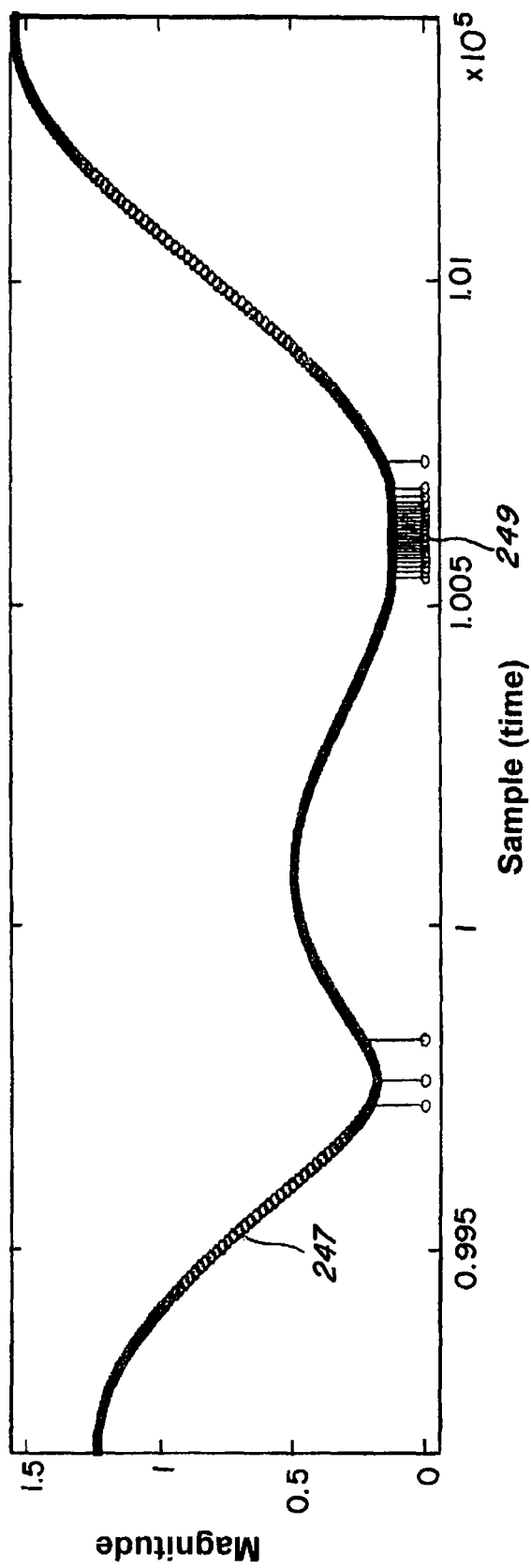
FIG. 19 is a graph of an overall magnitude waveform of a power amplifier at medium and low power ranges.

This lower power usage is also confirmed in a graph of overall magnitude of an output signal of a power amplifier of the present invention at medium power ranges. In FIG. 19, the magnitude of the output signal is plotted over time as shown by curve 247. At points 249, for example, the power amplifier is operating either in the compressed region or is inactive. At power ranges above a transition point, a predetermined power level, the power amplifier is operating in a DCM ERR mode as indicated by the curve 247. However, at low power range, below the predetermined power level, the power amplifier is operating in a DCM mode as indicated by the points 249.

Figure 20:
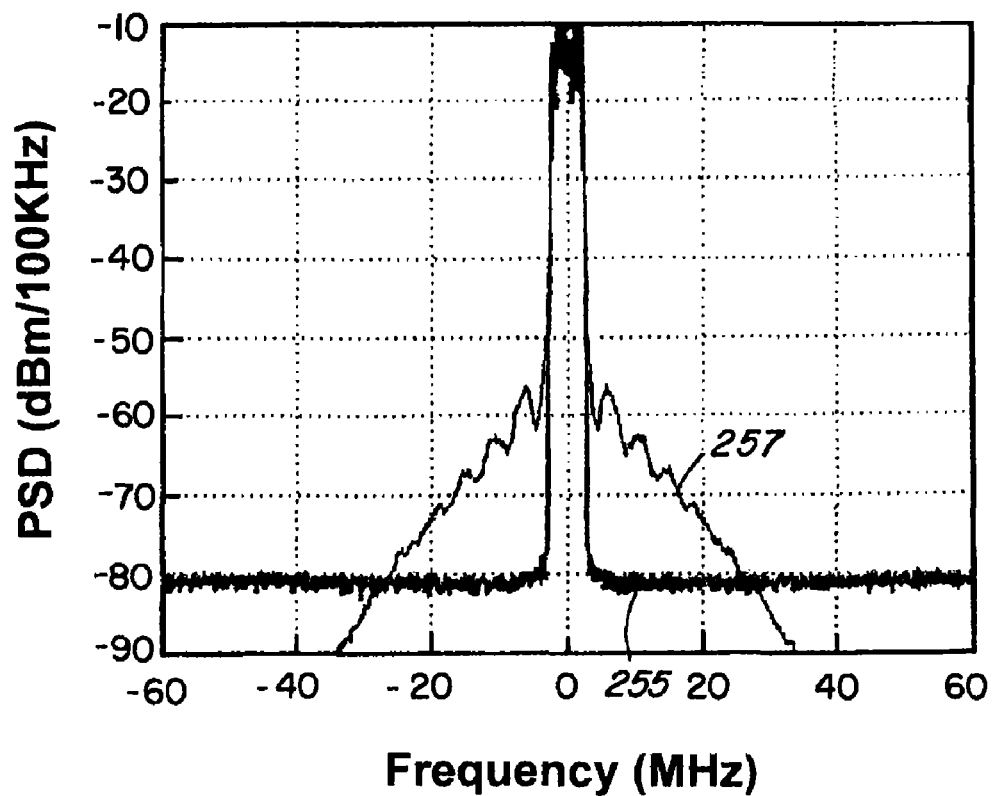
FIG. 20 is a graph of power spectral density comparison for a power amplifier operating in the EER mode and in the DCM ERR mode at low power ranges.

A comparison of the amplifier operating according to an Rx 45 noise specification shows the great improvement of the present invention. In FIG. 20 a plot of PSD, curve 255 shows a power amplifier operating in the DCM ERR mode. Curve 257 shows the power amplifier operating in an EER modulation mode.

What is claimed is:

1. A method for conserving power over a wide dynamic range in a power amplifier in response to a power level signal indicating a low, medium, or high power range, the method comprising the steps of:

operating the power amplifier in a duty cycle modulation envelope reduction and restoration ("DCM ERR") mode wherein power output of the power amplifier is selected to be between a first predetermined power threshold and a second predetermined power threshold when the power level signal indicates the medium power range; and operating the power amplifier in a duty cycle modulation ("DCM") mode wherein power output of the power amplifier is selected to be below the second predetermined power threshold when the power level signal indicates the low power range.

2. The method of claim 1 further comprising the step of:

operating the power amplifier in an envelope elimination and restoration ("EER") mode wherein power output of the power amplifier is selected to be above the first predetermined power threshold when the power level signal indicates the high power range.

3. The method of claim 2 wherein the first predetermined power threshold and the second predetermined power threshold are determined on the basis of adjacent channel leakage ratio ("ACLR") specifications and receive band noise specifications.

4. A system for conserving power in an RF transmitter comprising:

means for generating a power level signal indicating a low, medium, or high power range; and a power amplifier including a supply port and an RF input port, the power amplifier operating in a DCM ERR mode wherein power output of the power amplifier is selected to be between a first predetermined power threshold and a second predetermined power threshold when the power level signal indicates the medium power range, the power amplifier operating in a DCM mode wherein power output of the power amplifier is selected to be below the second predetermined power threshold when the power level signal indicates the low power range.

5. The system of claim 4 wherein the power amplifier operates in an EER mode when power output of the power amplifier is selected to be above the first predetermined power threshold when the power level signal indicates the high power range.

6. The system of claim 5 wherein the first predetermined power threshold and the second predetermined power threshold are determined on the basis of ACLR specifications, and receive band noise specifications at a 45 MHz offset.

7. A method for conserving power over a wide dynamic range in a power amplifier having an RF input port and a supply port, the method comprising the steps of:
receiving a power level signal indicating a low, medium, or high power range;
preparing a first amplitude component, above a predetermined amplitude threshold, a second amplitude component below the predetermined amplitude threshold, and a phase component, based on an in-phase component and a quadrature component;
modulating the second amplitude component onto a pulse sequence to generate a duty cycle modulated signal when the power level signal indicates the low or medium power range for the power amplifier causing the power output of the power amplifier to be below a first predetermined power threshold;
generating a constant envelope signal from the phase component;
combining the duty cycle modulated signal and the constant envelope signal;
supplying the combined signal to the RF input port of the power amplifier; and
supplying the first amplitude component to the supply port of the power amplifier when the power level signal indicates the medium or high power range for the power amplifier causing the power output of the power amplifier to be above a second predetermined power threshold which is below the first predetermined power threshold.

8. The method of claim 7 further comprising the step of:
amplifying the combined signal before supplying the combined signal to the RF input port.

9. The method of claim 7 further comprising the steps of:
generating a constant level signal when the power level signal indicates the low power range for the power amplifier causing the power output of the power amplifier to be below the second predetermined power threshold; and
supplying the constant level signal to the supply port of the power amplifier in place of the first amplitude component.

10. The method of claim 7 further comprising the step of:
supplying the constant envelope signal to the RF input port of the power amplifier in place of the combined signal when the power level signal indicates the high power range for the power amplifier causing the power output of the power amplifier to be above the first predetermined power threshold.

11. The method of claim 10 further comprising the step of:
amplifying the constant envelope signal before supplying the constant envelope signal to the RF-input port.

12. The method of claim 7 further comprising the step of:
determining the first predetermined power threshold and the second predetermined power threshold on the basis of adjacent channel leakage ratio ("ACLR) specifications, and receive band noise specifications at a 45 MHz offset.

13. The method of claim 7 wherein the first predetermined power threshold is between a range of 6 dBm to 24 dBm.

14. The method of claim 13 wherein the second predetermined power threshold is between a range of −50 dBm to 6 dBm.

15. The method of claim 14 wherein the second predetermined power threshold is between a range of −50 dBm to −22 dBm.

16. The method of claim 15 wherein the first predetermined power threshold is between a range of 12 dBm to 24 dBm.

17. A system for conserving power in an RF transmitter comprising:
means for generating a power level signal indicating a low, medium, or high power range;
a power amplifier having an RF input port and a supply port;
a signal decomposer preparing a first amplitude component above a predetermined amplitude threshold, a second amplitude component below the predetermined amplitude threshold, and a phase component, based on an in-phase component and a quadrature-phase component;
a duty cycle modulator receiving the second amplitude component and modulating the second amplitude component onto a pulse sequence to generate a duty cycle modulated signal, when the power level signal indicates the low or medium power range for the power amplifier causing the power output of the power amplifier to be below a first predetermined power threshold;
a constant envelop generator receiving the phase component and generating a constant envelope signal;
a combining unit combining the duty cycle modulated signal and the constant envelope signal and supplying the combined signal to the RF input port; and
a supply modulator receiving the first amplitude component from the signal decomposer and supplying the first amplitude component to the supply port when the power level signal indicates the medium or high power range for the power amplifier causing the power output of the power amplifier to be above a second predetermined power threshold, which is below the first predetermined power threshold.

18. The system of claim 17 further comprising a power controller receiving the power level signal and generating a threshold signal which is supplied to the signal decomposer for setting the predetermined amplitude threshold.

19. The system of claim 17 further comprising
an amplifier receiving the combined signal before supplying an amplified combined signal to the RF input port.

20. The system of claim 17 wherein the supply modulator generates a constant level signal and supplies the constant level signal to the supply port in place of the first amplitude component when the power level signal indicates the low power range for the power amplifier causing the power output of the power amplifier to be below the second predetermined power threshold.

21. The system of claim 17 wherein the constant envelope signal generator supplies the constant envelope signal to the RF input port in place of the combined signal when the power level signal indicates the high power range for the power amplifier causing the power output of the power amplifier to be above the first predetermined power threshold.

22. The system of claim 21 further comprising:

an amplifier receiving the constant envelope signal and providing an amplified constant envelope signal to the RF input port of the power amplifier.

23. The system of claim 17 wherein the first predetermined power threshold and the second predetermined power threshold are determined on the basis of adjacent channel leakage ratio ("ACLR") specifications and receive band noise specifications at a 45 MHz offset.

24. The system of claim 17 wherein the first predetermined power threshold is between a range of 6 dBm to 24 dBm and the second predetermined power threshold is between a range of −50 dBm to 6 dBm.

* * * * *

UNITED STATES PATENT AND TRADEMARK OFFICE
CERTIFICATE OF CORRECTION

PATENT NO. : 8,131,234 B2
APPLICATION NO. : 12/508464
DATED : March 6, 2012
INVENTOR(S) : Paul Cheng-Po Liang et al.

Page 1 of 1

It is certified that error appears in the above-identified patent and that said Letters Patent is hereby corrected as shown below:

Claim 12, Col. 14, line 4: "("ACLR)" should read --("ACLR")--;
Claim 17, Col. 14, line 37: "envelop" should read --envelope--.

Signed and Sealed this
Seventeenth Day of July, 2012

David J. Kappos
*Director of the United States Patent and Trademark Office*